(12) United States Patent
Fu et al.

(10) Patent No.: US 12,396,299 B2
(45) Date of Patent: Aug. 19, 2025

(54) LIGHT-EMITTING DIODE AND MANUFACTURING METHOD THEREOF

(71) Applicant: TYNTEK CORPORATION, Miaoli County (TW)

(72) Inventors: Yuan-Hui Fu, Miaoli County (TW); Yi-Hung Chen, Miaoli County (TW); Tai-Hsiang Hu, Miaoli County (TW)

(73) Assignee: Tyntek Corporation, Miaoli County (TW)

( * ) Notice: Subject to any disclaimer, the term of this patent is extended or adjusted under 35 U.S.C. 154(b) by 427 days.

(21) Appl. No.: 18/156,973

(22) Filed: Jan. 19, 2023

(65) Prior Publication Data
US 2023/0411564 A1    Dec. 21, 2023

(30) Foreign Application Priority Data

Jun. 14, 2022    (TW) .................................. 111122043

(51) Int. Cl.
| | |
|---|---|
| *H10H 20/841* | (2025.01) |
| *H10H 20/01* | (2025.01) |
| *H10H 20/821* | (2025.01) |
| *H10H 20/824* | (2025.01) |
| *H10H 20/831* | (2025.01) |
| *H10H 20/84* | (2025.01) |
| *H10H 20/857* | (2025.01) |

(52) U.S. Cl.
CPC ...... *H10H 20/841* (2025.01); *H10H 20/0133* (2025.01); *H10H 20/824* (2025.01); *H10H 20/8312* (2025.01); *H10H 20/857* (2025.01); *H10H 20/032* (2025.01); *H10H 20/034* (2025.01)

(58) Field of Classification Search
CPC ............. H10H 20/841; H10H 20/8312; H10H 20/032; H10H 20/84; H10H 20/831; H10H 20/821
See application file for complete search history.

(56) References Cited

U.S. PATENT DOCUMENTS

| | | | | |
|---|---|---|---|---|
| 2007/0090377 | A1* | 4/2007 | Lin ..................... | H10H 20/8312 257/94 |
| 2008/0029761 | A1* | 2/2008 | Peng ..................... | H10H 20/857 257/E33.013 |
| 2008/0054289 | A1* | 3/2008 | Tsai ..................... | H10H 20/816 438/22 |
| 2009/0242929 | A1* | 10/2009 | Lin ..................... | H10H 20/8162 257/E33.001 |

(Continued)

*Primary Examiner* — Mohsen Ahmadi
(74) *Attorney, Agent, or Firm* — Rosenberg, Klein & Lee

(57) ABSTRACT

A light-emitting diode (LED) and a manufacturing method thereof are disclosed. The LED includes: a substrate, a light-tight reflective layer, an inner epitaxial layer, an outer epitaxial layer, a non-conducting layer, an ohmic metallic body, a first electrode, and a second electrode. The inner epitaxial layer and the outer epitaxial layer are separated from each other by a separation space. In a view made from a top side of the LED, the separation space forms a closed path and surrounds the light exit hole. The separation space provides an effect of blocking an electrical current and a light emission area in the inner epitaxial layer. By redirecting light emitting from a lateral side of the inner epitaxial layer toward a top side of the LED, the LED shows a low side light ratio.

15 Claims, 22 Drawing Sheets

(56) References Cited

U.S. PATENT DOCUMENTS

| | | | | |
|---|---|---|---|---|
| 2010/0123161 A1* | 5/2010 | Takeuchi | ............ | H10H 20/833 |
| | | | | 438/33 |
| 2011/0284895 A1* | 11/2011 | Hsu | ...................... | H10H 20/819 |
| | | | | 257/E33.074 |
| 2012/0168715 A1* | 7/2012 | Horng | .................... | H10H 29/14 |
| | | | | 257/E33.012 |
| 2017/0250311 A1* | 8/2017 | Lin | ........................ | A01G 7/045 |
| 2021/0367105 A1* | 11/2021 | Wang | .................. | H10H 20/811 |
| 2022/0181531 A1* | 6/2022 | Wang | .................. | H10H 20/831 |
| 2023/0178685 A1* | 6/2023 | Feng | .................... | H10H 20/816 |
| | | | | 257/103 |
| 2023/0238482 A1* | 7/2023 | Chen | .................... | H10H 20/812 |
| | | | | 257/76 |

\* cited by examiner

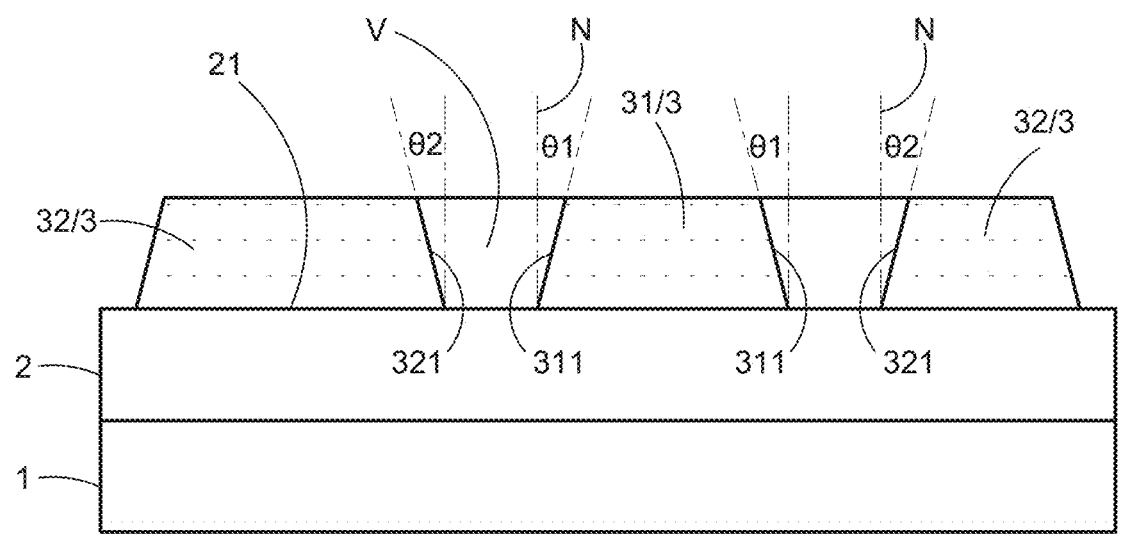
FIG.6D1

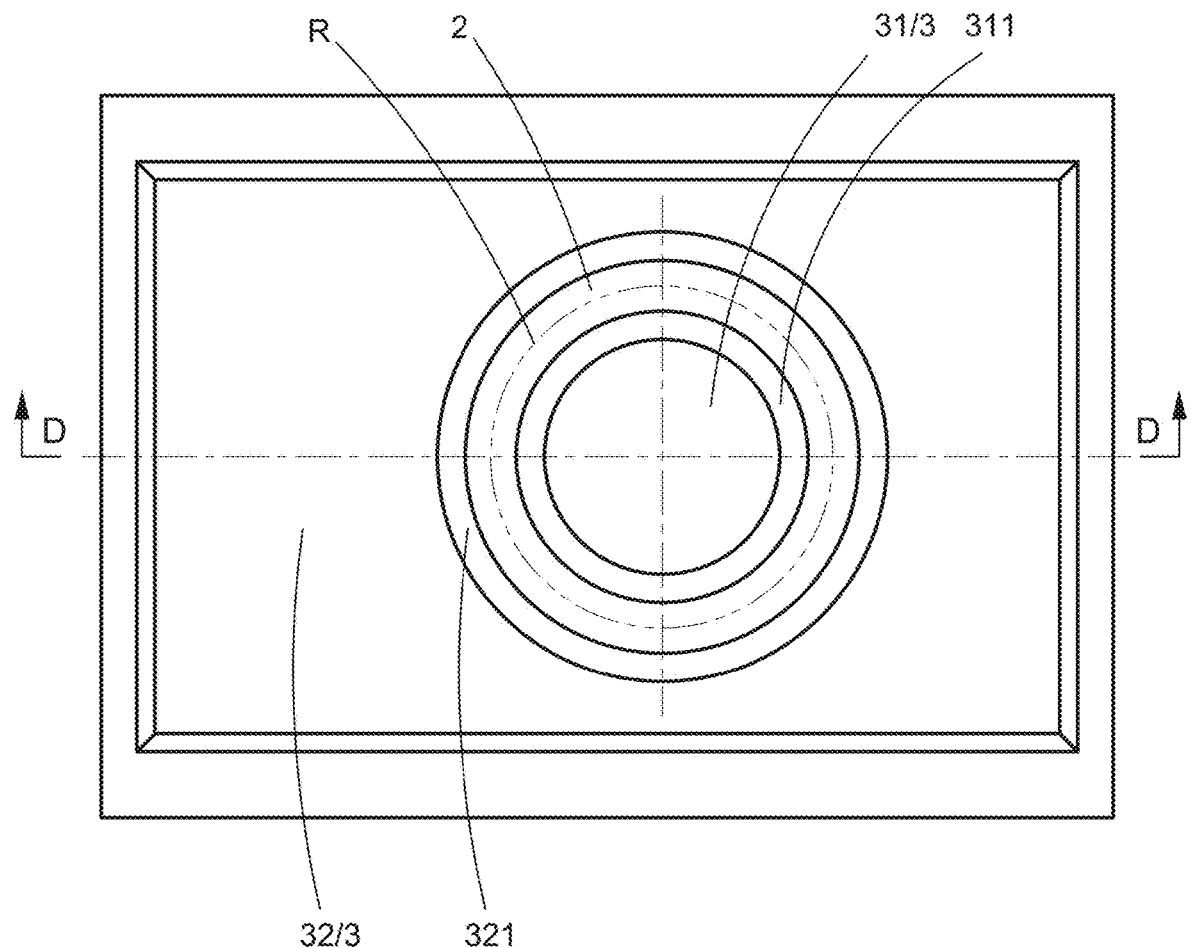
FIG.6D2

LIGHT-EMITTING DIODE AND MANUFACTURING METHOD THEREOF

FIELD OF THE INVENTION

The present invention relates to a light-emitting diode (LED) and a manufacturing method thereof, and more particular to an LED that includes a separate space that blocks an epitaxial layer current to reduce sideway light emission.

BACKGROUND OF THE INVENTION

An optical encoder is a sensor device that is commonly used in electronic and mechanical devices to detect the status of movement and rotation of a detected element. The optical encoder is made up of components including an encoder disc, an optical signal generator, and a photodetector. The encoder disc includes multiple transparent and opaque areas. Rotation of the encoder disc allows the photodetector to receive a specific optical signal, and the optical signal is converted by the photodetector into an electrical signal to determine the displacement of the detected element.

An LED is commonly used as the optical signal generator in a reflective encoder. As shown in FIG. 1, when an LED E is used in a reflective encoder RE, light L emitting from the LED E is reflected by the opaque areas of an encoder disc ED at an upper side toward a photodetector D. Since the LED E and the photodetector D are located on the same side, sideway light SL of the LED L will also be received by the photodetector and become noise to affect the accuracy of measurement. Thus, it is a challenge to reduce the sideway light emission of the LED.

SUMMARY OF THE INVENTION

To alleviate the insufficiency of the prior art, the present inventor has conducted researches and develops a light-emitting diode (LED), which comprises a substrate, which comprises a top surface and a bottom surface, the top surface and the bottom surface being opposite to each other; a light-tight reflective layer, which is formed on the top surface of the substrate; an epitaxial layer, which comprises an inner epitaxial layer and an outer epitaxial layer, wherein the inner epitaxial layer is formed on a poring of the top surface of the light-tight reflective layer, and the outer epitaxial layer is formed on a portion of the top surface of the light-tight reflective layer and surrounds the inner epitaxial layer, the inner epitaxial layer and the outer epitaxial layer being not in contact with each other, a separation space being located between the inner epitaxial layer and the outer epitaxial layer, wherein, in a view made from a topside of the LED, the separation space forms a closed path, and in a cross-section perpendicular to the closed path, an outside wall of the inner epitaxial layer, an inside wall of the outer epitaxial layer, and a portion of the top surface of the light-tight reflective layer jointly define an inverted trapezoid cross-section, and two sides of the inverted trapezoid cross-section are respectively formed of the outside wall of the inner epitaxial layer and the inside wall of the outer epitaxial layer, and a base of the inverted trapezoid cross-section is formed of the portion of the top surface of the light-tight reflective layer, an included angle between the outside wall of the inner epitaxial layer and a normal line of the top surface of the light-tight reflective layer being from 2 to 30 degrees, an included angle between the inside wall of the outer epitaxial layer and a normal line of the top surface of the light-tight reflective layer being from 2 to 30 degrees; a non-conducting layer, which covers a top surface and the outside wall of the inner epitaxial layer and a top surface and the inside wall of the outer epitaxial layer, and covers a portion of the top surface of the light-tight reflective layer between the inner epitaxial layer and the outer epitaxial layer, the non-conducting layer comprising a light-transmitting material; an ohmic metallic body, which is disposed in the non-conducting layer, the ohmic metallic body being in electrical connection with the inner epitaxial layer; a first electrode, which is in electrical connection with the ohmic metallic body, the first electrode comprising a light-reflecting material, a light exit hole in a circular form being formed in the first electrode, the light exit hole being located in a top side of the LED, wherein, in a view made from a top side of the LED, the separation space forms a closed path and surrounds the light exit hole; and a second electrode, which is in electrical connection with the inner epitaxial layer.

In an embodiment of the LED according to the present invention, the first electrode is arranged on a portion of the non-conducting layer that covers the top surface and the outside wall of the inner epitaxial layer, and is also arranged on a portion of the non-conducting layer that covers the top surface and the inside wall of the outer epitaxial layer, and is also arranged on a portion of the non-conducting layer that covers the top surface of the light-tight reflective layer between the inner epitaxial layer and the outer epitaxial layer.

In an embodiment of the LED according to the present invention, the first electrode is arranged on a portion of the non-conducting layer that covers the top surface of the inner epitaxial layer and does not block light emitting from the outside wall of the inner epitaxial layer, the non-conducting layer comprising one film or a stack of multiple films, the non-conducting layer being arranged to redirect light emitting from an inside wall of the inner epitaxial layer toward a top side of the LED, the LED further comprising a side light reflecting layer, the side light reflecting layer being arranged on a portion of the non-conducting layer that covers the inside wall of the outer epitaxial layer, the side light reflecting layer being arranged to reflect light emitting from the outside wall of the inner epitaxial layer toward the top side of the LED.

In an embodiment of the LED according to the present invention, the first electrode is arranged on a portion of the non-conducting layer that covers the top surface of the inner epitaxial layer and does not block light emitting from the outside wall of the inner epitaxial layer, the non-conducting layer comprising one film or a stack of multiple films, the non-conducting layer being arranged to redirect or reflect light emitting from an inside wall of the inner epitaxial layer toward a top side of the LED.

In an embodiment of the LED according to the present invention, the non-conducting layer is formed of a film of at least one of silicon nitride, silicon oxynitride, silicon dioxide, and titanium dioxide.

In an embodiment of the LED according to the present invention, in a view made from a topside of the LED, the closed path is circular in shape, and the separation space and the light exit hole form concentric circles.

In an embodiment of the LED according to the present invention, the substrate comprises a silicon substrate, an aluminum oxide substrate, or an aluminum nitride substrate.

In an embodiment of the LED according to the present invention, a material of the epitaxial layer comprises aluminum gallium indium phosphide (AlInGaP) or aluminum gallium arsenide (AlGaAs).

The present invention also provides a light-emitting diode (LED) manufacturing method, which comprises: providing a substrate, wherein the substrate comprises a top surface and a bottom surface, the top surface and the bottom surface being opposite to each other; forming a light-tight reflective layer on a top surface of the substrate; forming an epitaxial layer on a top surface of the light-tight reflective layer; removing a portion of a material of the epitaxial layer to expose the light-tight reflective layer, wherein the removed portion of the epitaxial layer forms a separation space, and the separation space splits the epitaxial layer into an inner epitaxial layer and an outer epitaxial layer, such that the outer epitaxial layer surrounds the inner epitaxial layer, wherein, in a view made from a top side of the LED, the separation space forms a closed path and surrounds a light exit hole, and, in a cross-section perpendicular to the closed path, an outside wall of the inner epitaxial layer, an inside wall of the outer epitaxial layer, and a portion of the top surface of the light-tight reflective layer jointly define an inverted trapezoid cross-section, two sides of the inverted trapezoid cross-section being respectively formed of the outside wall of the inner epitaxial layer and the inside wall of the outer epitaxial layer, a base of the inverted trapezoid cross-section being formed of the portion of the top surface of the light-tight reflective layer, an included angle between the outside wall of the inner epitaxial layer and a normal line of the top surface of the light-tight reflective layer being from 2 to 30 degrees, an included angle between the inside wall of the outer epitaxial layer and a normal line of the top surface of the light-tight reflective layer being from 2 to 30 degrees; forming a non-conducting layer, such that the non-conducting layer covers a top surface and the outside wall of the inner epitaxial layer and a top surface and the inside wall of the outer epitaxial layer, and also covers the top surface of the light-tight reflective layer between the inner epitaxial layer and the outer epitaxial layer, wherein the non-conducting layer comprises a light-transmitting material; removing a portion of a material of the non-conducting layer and forming an ohmic metallic body in the portion of the non-conducting layer from which the material is removed, so as to have the ohmic metallic body and the epitaxial layer electrically connected; forming a first electrode, such that the first electrode is electrically connected with the ohmic metallic body, and forming a light exit hole penetrating through the first electrode, wherein the first electrode is non-light-transmittable, and the light exit hole is located on a top of the LED, wherein, in a view made from a top side of the LED, the separation space forms a closed path and surrounds the light exit hole; and forming a second electrode, such that the second electrode is electrically connected with the inner epitaxial layer.

In an embodiment of the LED manufacturing method according to the present invention, the first electrode is formed on a portion of the non-conducting layer that covers the top surface and the outside wall of the inner epitaxial layer and is also formed on a portion of the non-conducting layer that covers the top surface and the inside wall of the outer epitaxial layer, and is also formed on a portion of the non-conducting layer that covers the top surface of the light-tight reflective layer between the inner epitaxial layer and the outer epitaxial layer.

In an embodiment of the LED manufacturing method according to the present invention, the first electrode is formed on a portion of the non-conducting layer that covers the top surface and the outside wall of the inner epitaxial layer, and the LED manufacturing method further comprises forming a side light reflecting layer on a portion of the non-conducting layer that covers the inside wall of the outer epitaxial layer.

In an embodiment of the LED manufacturing method according to the present invention, the non-conducting layer is formed of a film or is alternatively formed of a stack of multiple films.

In an embodiment of the LED manufacturing method according to the present invention, in a view made from a top side of the LED, the closed path is circular in shape, and the separation space and the light exit hole form concentric circles.

In an embodiment of the LED manufacturing method according to the present invention, the removal of the portion of the material of the epitaxial layer is performed by subjecting the epitaxial layer to etching by applying chemicals.

In an embodiment of the LED manufacturing method according to the present invention, the removal of the portion of the material of the epitaxial layer is performed by subjecting the epitaxial layer to etching by means of inductively coupled plasma (ICP).

The LED according to the present invention uses a separation space to constrain an electrical current and a light emission area in an inner epitaxial layer when energized. In some embodiments, the LED includes a first electrode that is light reflective and covers a top surface and an outside wall of the inner epitaxial layer to block and reflect light emitting from the inner epitaxial layer so as to prevent light from emitting outwards from a lateral side of the inner epitaxial layer and to direct light toward a light exit hole on a top of the LED. In some embodiments, the LED includes a non-conducting layer including a single layer of a stack of multiple layers of light-transmitting materials arranged slantways and a side light reflecting layer including a light-reflecting material arranged slantways to direct light emitting from the lateral side of the inner epitaxial layer toward the top surface of the LED. Numerous technical solutions for directing light emitting from an LED, when energized, toward a top surface of the LED are provided in the present invention, and the LED of the present invention shows a relatively low side light ratio. The LED according to the present invention, when applied to a reflective encoder, helps reduce noise of optical sensors and reduce the chance of erroneous detection.

BRIEF DESCRIPTION OF THE DRAWINGS

FIGS. 6A-6I are schematic views respectively showing forming of each of components of the LED according to the present invention, wherein FIG. 6D1 is a cross-sectional view taken along line D-D of FIG. 6D2;

DETAILED DESCRIPTION OF THE PREFERRED EMBODIMENTS

A detailed description of the present invention, and technical contents thereof, will be explained below with reference to the drawings. The drawings are provided only for illustration and reference to assist understanding of the present invention, and are not intended to limit the scope of the present invention.

Figure 2A:
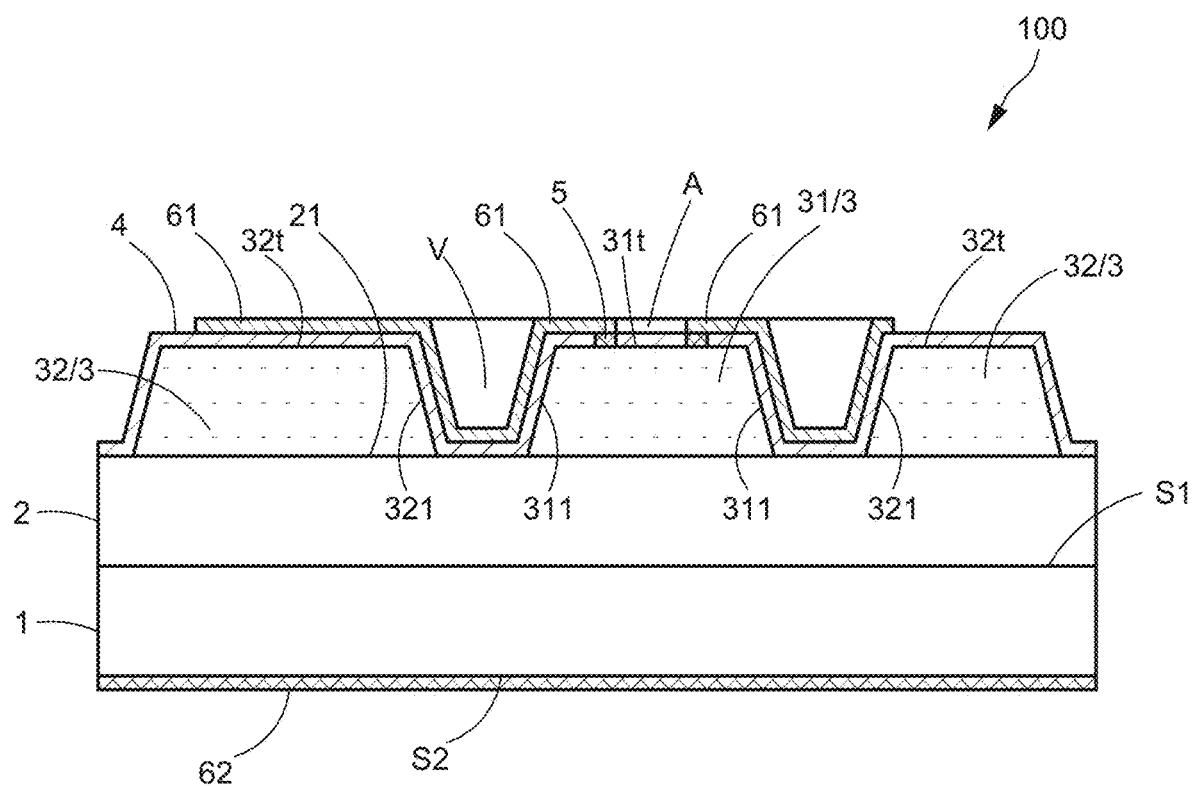
FIG. 2A is schematic front view of an embodiment of a light-emitting diode (LED) according to the present invention, shown as a cross-sectional view taken along line B-B of FIG. 2B.
Figure 2B:
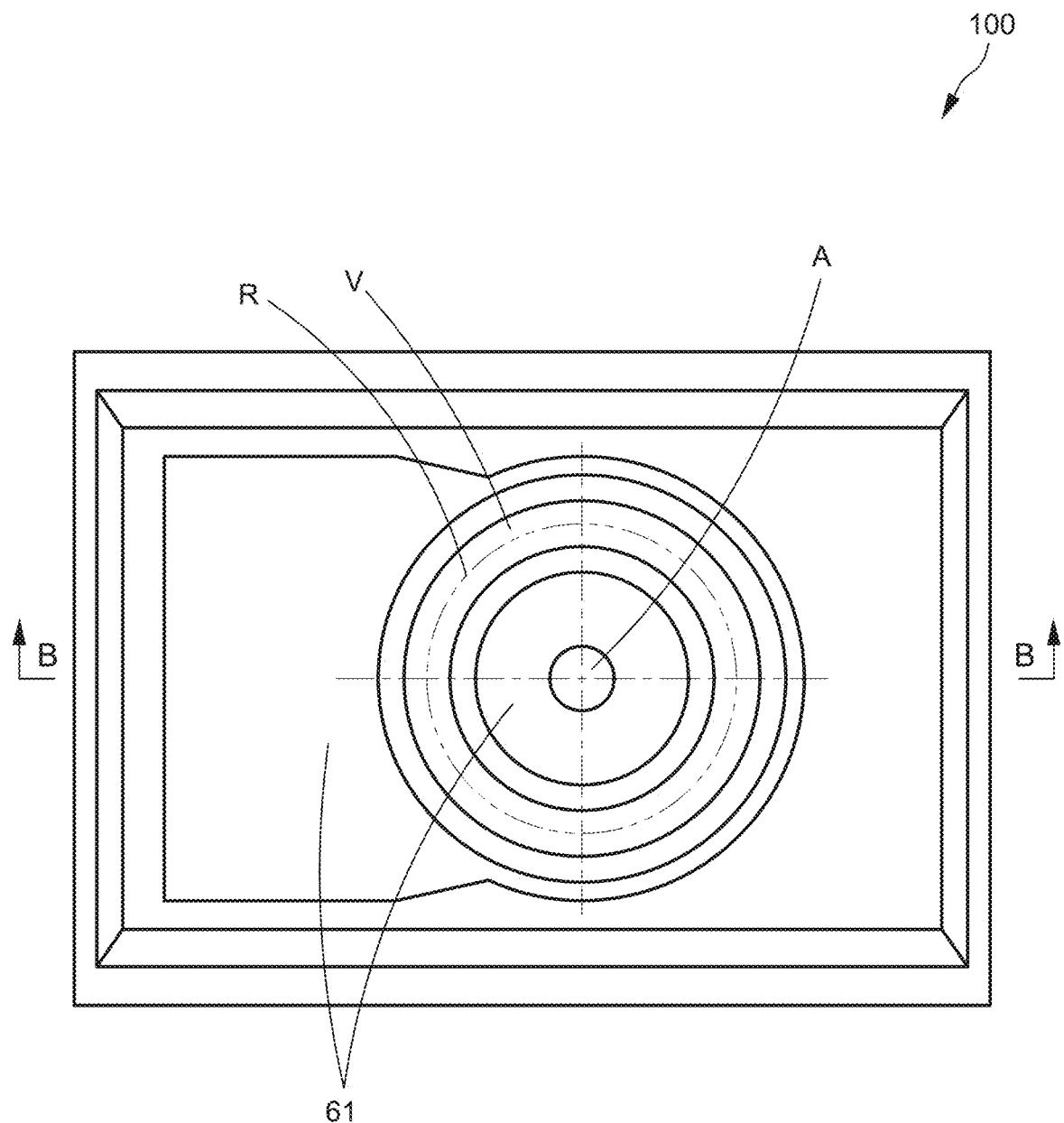
FIG. 2B is a top plan view of the embodiment of the LED shown in FIG. 2A.

Referring to FIGS. 2A and 2B, in an embodiment of a light-emitting diode (LED) according to the present invention the LED 100 comprises: a substrate 1, a light-tight reflective layer 2, an epitaxial layer 3, a non-conducting layer 4, an ohmic metallic body 5, a first electrode 61, and a second electrode 62.

The substrate 1 includes a top surface S1 and a bottom surface S2 that are opposite to each other. The substrate 1 may be a silicon substrate, or may alternatively be an aluminum oxide ($Al_2O_3$) substrate or an aluminum nitride (AlN) substrate.

The light-tight reflective layer 2 is formed on a top surface S1 of the substrate 1 to reflect light emitting from the inner epitaxial layer 31 toward a top side. A material of the light-tight reflective layer 2 may be a metal and is formed on the top surface S1 of the substrate 1 through suitable techniques of deposition.

Figure 1:
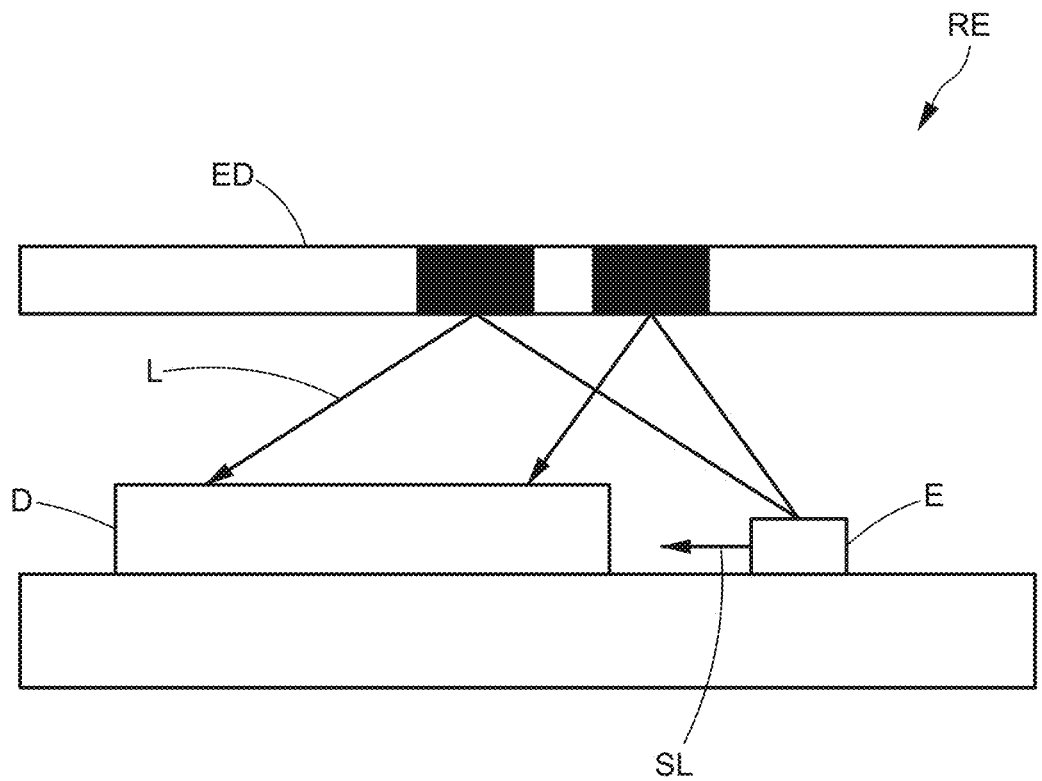
FIG. 1 is a schematic view showing a reflective encoder.
Figure 2C:
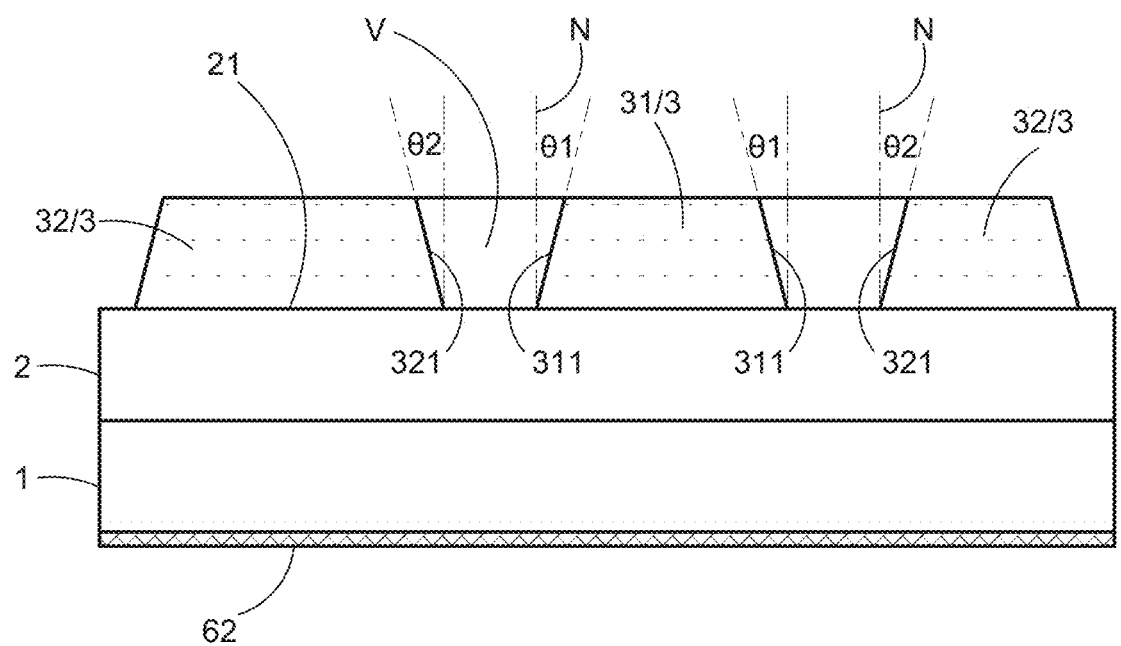
FIG. 2C is a schematic view showing a structure of the LED of FIG. 2A with a non-conducting layer, an ohmic metallic body, a first electrode, and a second electrode omitted, illustrating angles of an outside wall of an inner epitaxial layer and an inside wall of an outer epitaxial layer relative to a top surface of a light-tight reflective layer, FIG. 2C being a cross-sectional view taken along line C-C of FIG. 2D.
Figure 2D:
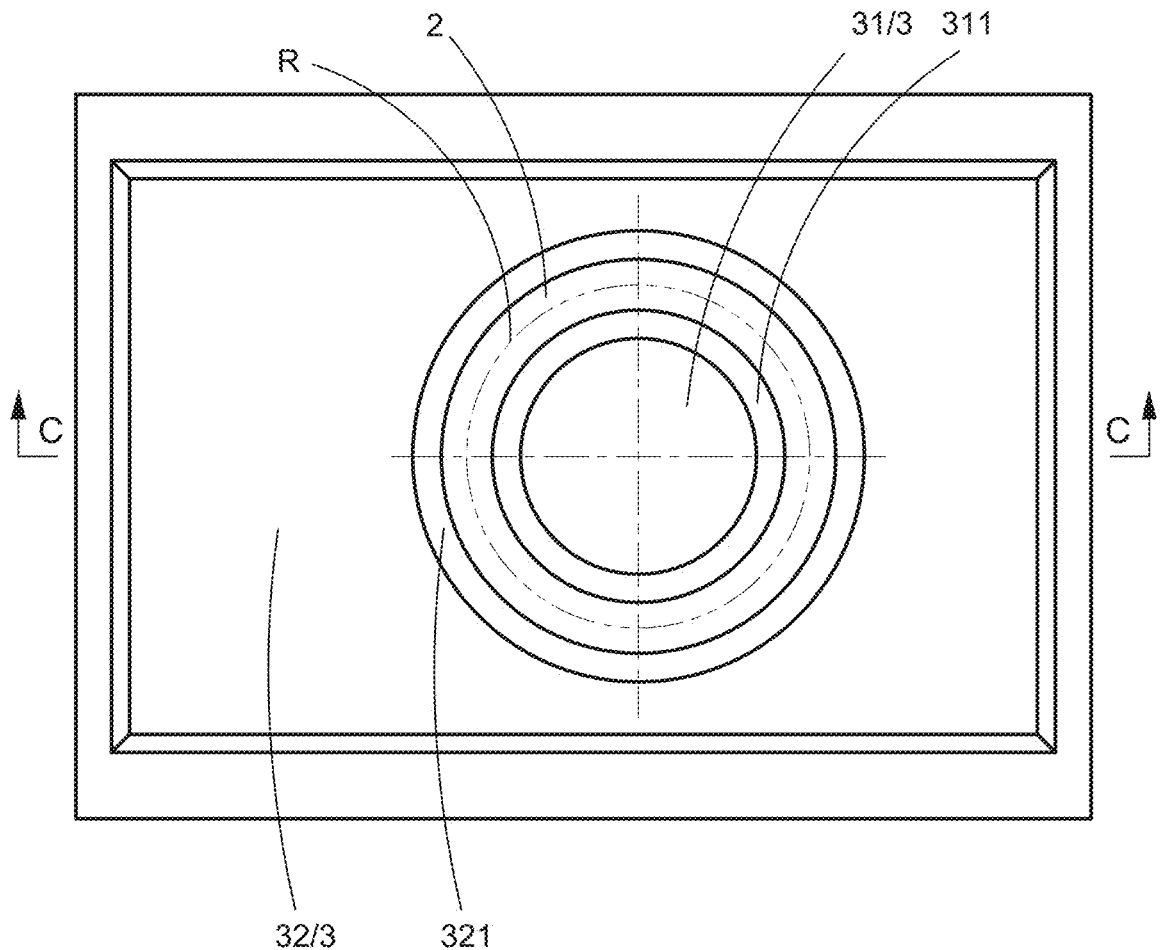
FIG. 2D is a top plan view showing a structure of FIG. 2C.

FIGS. 2C and 2D respectively show structures of the LED 100 shown in FIGS. 2A and 2B, with the non-conducting layer 4, the ohmic metallic body 5, the first electrode 61, and the second electrode 62 omitted. The epitaxial layer 3 comprises an inner epitaxial layer 31 and an outer epitaxial layer 32. The inner epitaxial layer 31 is formed on a portion of the top surface 21 of the light-tight reflective layer 2. The outer epitaxial layer 32 is formed on a portion of the top surface 21 of the light-tight reflective layer 2 and surrounds the inner epitaxial layer 31. The inner epitaxial layer 31 and the outer epitaxial layer 32 are not in contact with each other. The inner epitaxial layer 31 and the outer epitaxial layer 32 include a separation space V arranged therebetween. As shown in FIGS. 6C, 6D1, and 6D2, after the epitaxial layer 3 is formed on the top surface of the light-tight reflective layer 2, a portion of the material of the epitaxial layer 3 can be removed to form the separation space V, the inner epitaxial layer 31, and the outer epitaxial layer 32. A material of the epitaxial layer 3 may be aluminum gallium indium phosphide (AlInGaP) or aluminum gallium arsenide (AlGaAs), which is grown, through suitable techniques of epitaxial growth, on the light-tight reflective layer 2. The epitaxial layer 3 includes a p-type doped area, an n-type doped area, and a light emission area (not shown in the drawings), and can emit light when an electrical current flowing therethrough.

As shown in FIGS. 2B and 2D, in a view made from a top side of the LED 100, the separation space V forms a closed path R. in the embodiment shown in FIG. 2B, the closed path R is circular. The closed path R can alternatively be a square or other closed shapes. As shown in FIG. 2C, in a cross-section perpendicular to the closed path R, an outside wall 311 of the inner epitaxial layer 31, an inside wall 321 of the outer epitaxial layer 32, and a portion of the top surface 21 of the light-tight reflective layer 2 jointly define an inverted trapezoid cross-section. Two sides of the inverted trapezoid cross-section are respectively formed of the outside wall 311 of the inner epitaxial layer 31 and the inside wall 321 of the outer epitaxial layer 32, and a base of the inverted trapezoid cross-section is formed of the portion of the top surface 21 of the light-tight reflective layer 2. An included angle $\theta 1$ between the outside wall 311 of the inner epitaxial layer 31 and a normal line N of the top surface 21 of the light-tight reflective layer 2 is from 2 to 30 degrees, and an included angle $\theta 2$ between the inside wall 321 of the outer epitaxial layer 32 and the normal line N of the top surface 21 of the light-tight reflective layer 2 is from 2 to 30 degrees.

The non-conducting layer 4 covers a top surface 31*t* and the outside wall 311 of the inner epitaxial layer 31, and a top surface 32*t* and the inside wall 321 of the outer epitaxial layer 32, and also covers the top surface 21 of the light-tight reflective layer 2 located between the inner epitaxial layer 31 and the outer epitaxial layer 32. A material of the non-conducting layer 4 is a light-transmitting material and can be formed of a film of one single layer or a stack of multiple layers (not shown in the drawings). The non-conducting layer 4 is formed of a film of at least one of silicon nitride ($SiN_y$), silicon oxynitride (SiON), silicon dioxide ($SiO_2$), titanium dioxide ($TiO_2$).

The ohmic metallic body 5 is arranged in the non-conducting layer 4. The ohmic metallic body 5 is in electrical connection with the inner epitaxial layer 31. A material of the ohmic metallic body 5 may be a metallic or alloy material that is suitable for forming an ohmic contact with the inner epitaxial layer 31 and electrically conductive.

The first electrode 61 is in electrical connection with the ohmic metallic body 5. The second electrode 62 is in electrical connection with the inner epitaxial layer 31. Based on electrical conductivity of the substrate 1 and the light-tight reflective layer 2, the second electrode 62 can be arranged on the bottom surface S2 of the substrate 1 to be in electrical connection with the inner epitaxial layer 31 directly by means of the substrate 1 and the light-tight reflective layer 2, or in electrical connection with the inner epitaxial layer 31 by means of a suitable via and conductor structure (not shown in the drawings). The LED 100 are connected through the first electrode 61 and the second electrode 62 to an external circuit to receive an external voltage. In the instant embodiment, the first electrode 61 is arranged on a top of the LED 100, and the second electrode 62 is arranged on a bottom of the LED 100 (the bottom surface S2 of the substrate 1). Materials of the first electrode 61 and the second electrode 62 can respectively be metallic or alloy materials that are suitable for forming an ohmic contact with the ohmic metallic body 5 and the inner epitaxial layer 31 and electrically conductive.

The first electrode is made of a light reflective material. A light exit hole A, which is circular, is formed in the first electrode 61. The light exit hole A allows light emitting from the inner epitaxial layer 31 to transmit outwards. As shown in FIG. 2B, in a view made from a top side of the LED 100, the separation space V forms a closed path R and surrounds the light exit hole A. The separation space V and the light exit hole A are formed as concentric circles.

Since the inner epitaxial layer 31 and the outer epitaxial layer 32 are not in contact with each other, an electrical current, when supplied, is constrained within the inner epitaxial layer 31 so as to increase an output power of the LED 100. In a structure, where no shielding is made on a lateral side of the inner epitaxial layer 31 and light is allowed to exit therefrom, the inverted trapezoid cross-sectional shape defined between the inner epitaxial layer 31 and the outer epitaxial layer 32 helps redirect light emitting from a lateral side of 円 the inner epitaxial layer 31 (the outside wall 311) in a direction toward a top side of the LED 100. When the included angle between the outside wall 311 of the inner epitaxial layer 31 and the normal line N of the top surface 21 of the light-tight reflective layer 2 is from 2 to 30 degrees, and the included angle between the inside wall 321 of the outer epitaxial layer 32 and the normal line N of the top surface 21 of the light-tight reflective layer 2 is from 2 to 30 degrees, sideways lighting is made lower as compared to other angular ranges.

In the LED 100 shown in FIG. 2A, the first electrode 61 is arranged on a portion of the non-conducting layer 4 that covers the top surface 31t and the outside wall 311 of the inner epitaxial layer 31, a portion of the non-conducting layer 4 that covers the top surface 32t and the inside wall 321 of the outer epitaxial layer 32, and a portion of the non-conducting layer 4 that covers the top surface 21 of the light-tight reflective layer 2 between the inner epitaxial layer 31 and the outer epitaxial layer 32. In the LED 100, the first electrode 61 blocks light leaving from the top surface 31t of the inner epitaxial layer 31 and a majority of light leaving from the outside wall 311 and reflects the light back into the inner epitaxial layer 31, in order to have a major portion of light emitting from the inner epitaxial layer 31 to transmit out of the LED 100 through the light exit hole A. Further, the first electrode 61 does not cover an outer side of the outer epitaxial layer 32 in order to prevent from being excessively close to an edge of the LED 100 and causing electrical leaking and failure of components.

Figure 3:
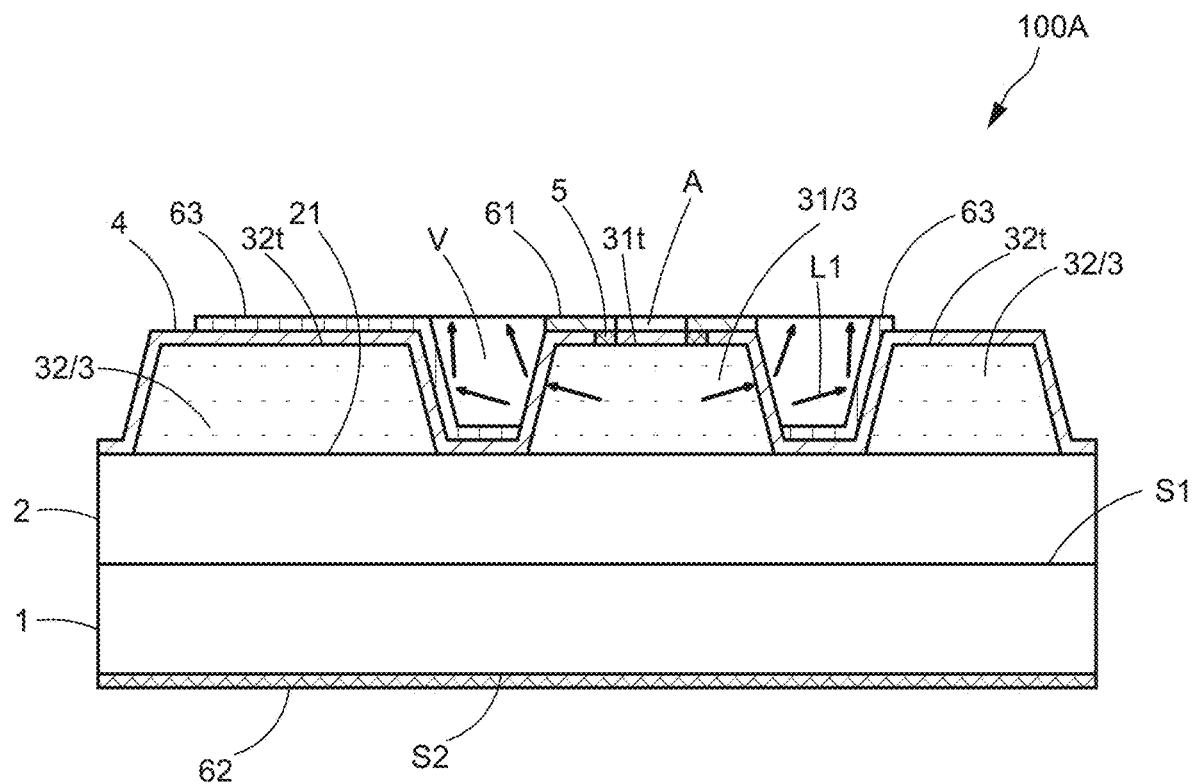
FIG. 3 is a front-side schematic cross-sectional view of another embodiment of the LED according to the present invention.

An LED 100A shown in FIG. 3 demonstrates an embodiment in which no shielding is provided on a lateral side of the inner epitaxial layer 31 to allow light to exit therefrom. In the LED 100A, the first electrode 61 is arranged on a portion of the non-conducting layer 4 that covers the top surface 31t of the inner epitaxial layer 31 and does not block light emitting from the outside wall 311 of the inner epitaxial layer 31. The non-conducting layer 4 comprises a light-transmitting material and is formed of a single or multiple films (not shown in the drawings). The non-conducting layer 4 is formed of a film of at least one of silicon nitride ($SiN_y$), silicon oxynitride (SiON), silicon dioxide ($SiO_2$), and titanium dioxide ($TiO_2$). Reflective index of the single or multiple films of the non-conducting layer 4 is arranged to adjust the state of light reflection, in order to redirect light emitting from the lateral side (the outside wall 311) of the inner epitaxial layer 31 toward a top side of the LED 100A, as indicated by arrows in the drawing.

The LED 100A further comprises a side light reflecting layer 63. The side light reflecting layer 63 is arranged on a portion of the non-conducting layer 4 that covers the inside wall 321 of the outer epitaxial layer 32. The side light reflecting layer 63 is arranged to reflect light emitting from the outside wall 311 of the inner epitaxial layer 31 toward the top side of the LED 100A, in order to have light L1 that has not fully redirected by the non-conducting layer 4 toward the top side of the LED 100 reflected upwards. The first electrode 61 and the side light reflecting layer 63 may use the same light-reflecting material and formed in the same deposition operation (such as evaporation). A preferred material of the side light reflecting layer 63 is a metal, but is not limited to metals. The side light reflecting layer 63 may be extended to a portion of the non-conducting layer 4 that covers the top surface 32t of the outer epitaxial layer 32 and may also be extended to the portion of the non-conducting layer 4 that covers the top surface 21 of the light-tight reflective layer 2 between the inner epitaxial layer 31 and the outer epitaxial layer 32. Further, the side light reflecting layer 63 may comprise a conductive material for wire bonding and is electrically connected with the first electrode 61 by means of a transparent conductive layer (such as indium tin oxide (ITO)) or wiring (not shown in the drawings).

Figure 4:
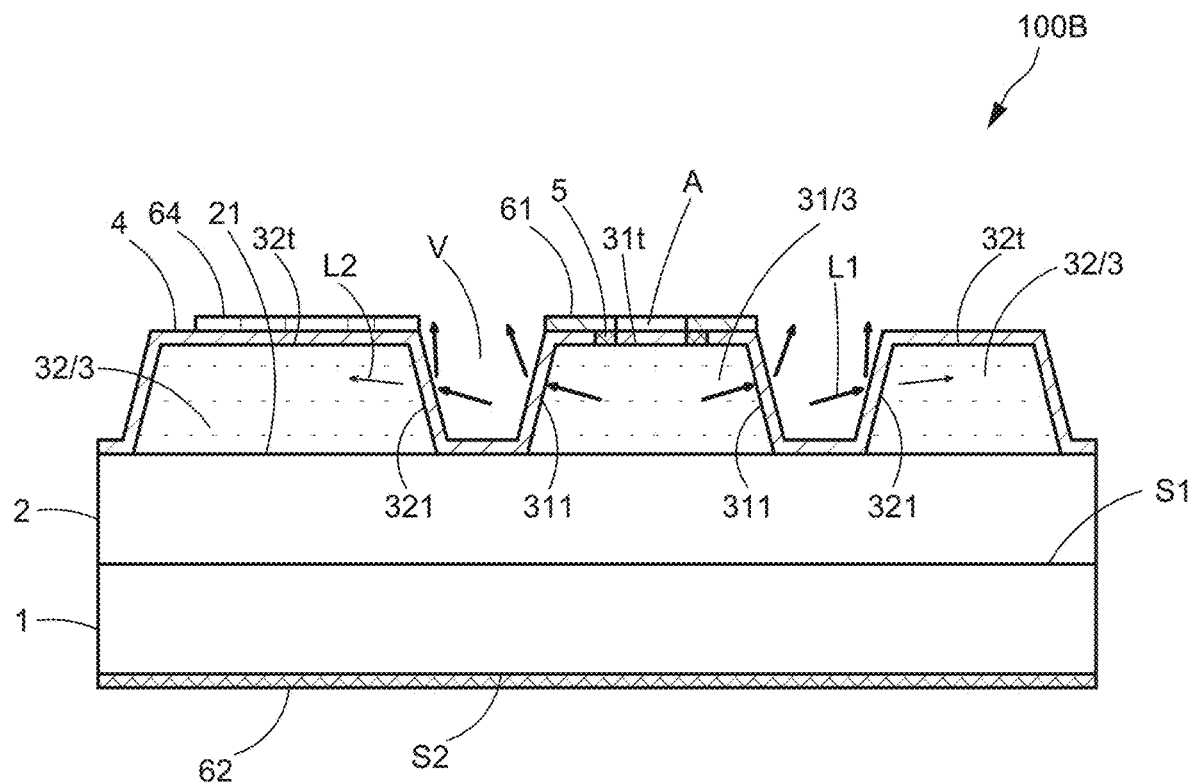
FIG. 4 is a front-side schematic cross-sectional view of a further embodiment of the LED according to the present invention.

The LED 100B shown in FIG. 4 demonstrates another embodiment in which light is allow to exit from the lateral side of the inner epitaxial layer 31. In the LED 100B, the first electrode 61 is arranged on a portion of the non-conducting layer 4 that covers the top surface 31t of the inner epitaxial layer 31 and does not block light emitting from the outside wall 311 of the inner epitaxial layer 31. The LED 100B is different from the LED 100A of FIG. 3 in that no side light reflecting layer 63 is included, and light emitting from the outside wall 311 of the inner epitaxial layer 31 is all redirected or reflected by the non-conducting layer 4 toward the top side of the LED 100B. As shown in FIG. 4, such a structure of the LED 100B may generate minute side light L2. Further, the LED 100B may, if desired, be provided with a wire bonding portion 64 for wire bonding and is electrically connected with the first electrode 61 by means of a transparent conductive layer (such as indium tin oxide (ITO)) or wiring (not shown in the drawings).

Figure 5:
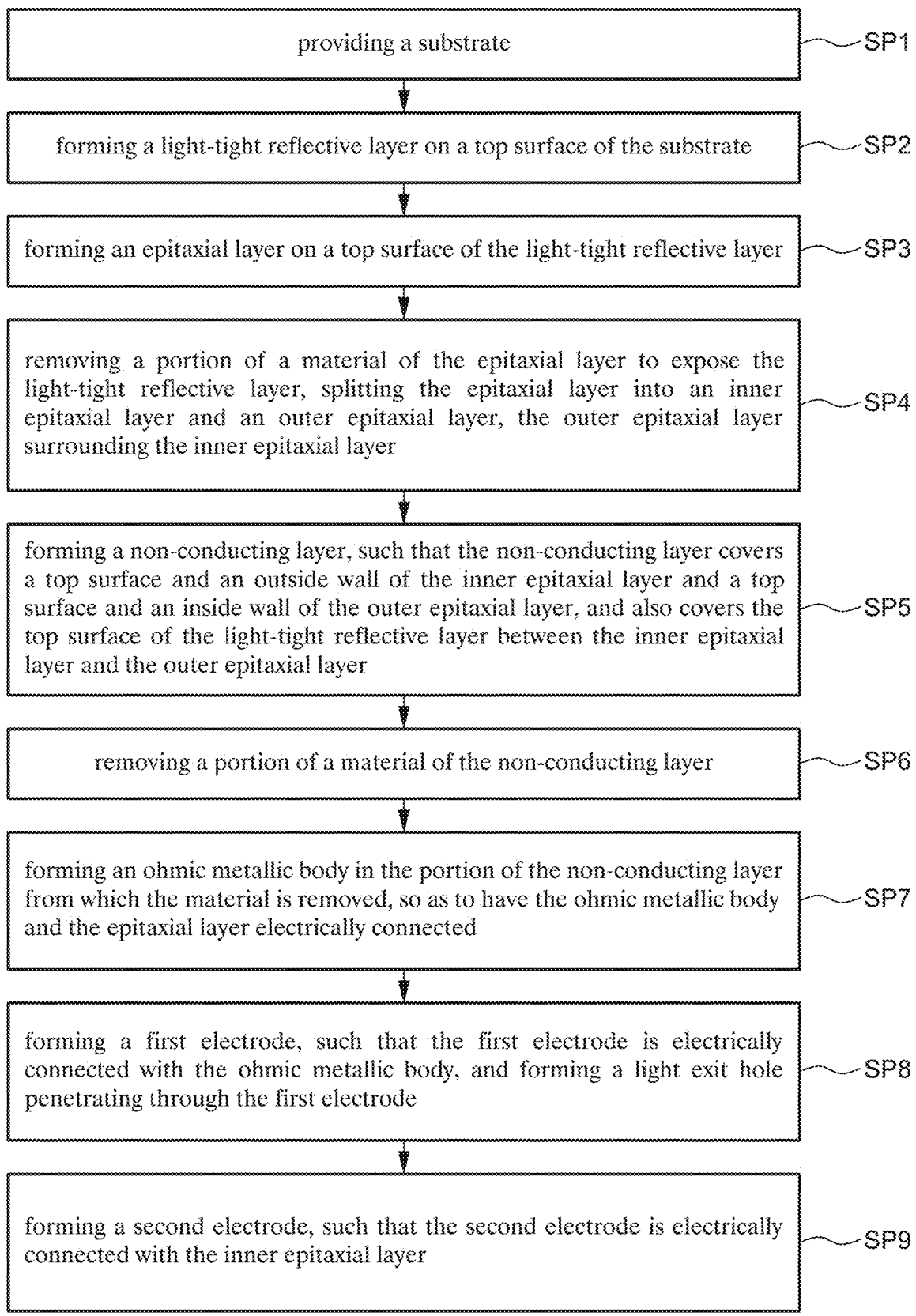
FIG. 5 is a flow chart showing a manufacturing method of the LED according to the present invention.

A flow of an LED manufacturing method according to the present invention is illustrated in FIG. 5. FIGS. 6A-6I respectively show, in a schematic way, forming processes of components in the LED manufacturing method according to the present invention.

Figure 6A:
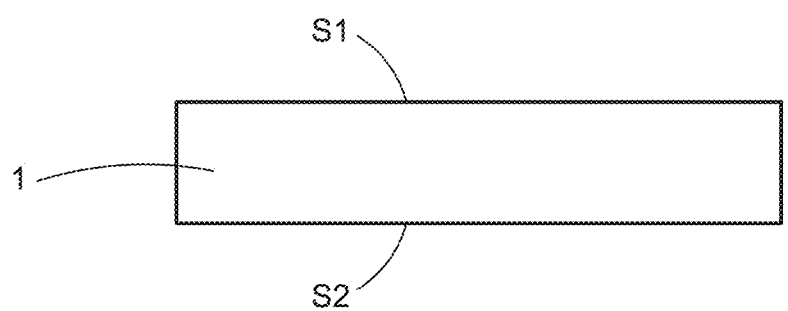

The LED manufacturing method according to the present invention comprises the following steps:

Step SP1: providing a substrate 1, as shown in FIG. 6A.

Figure 6B:
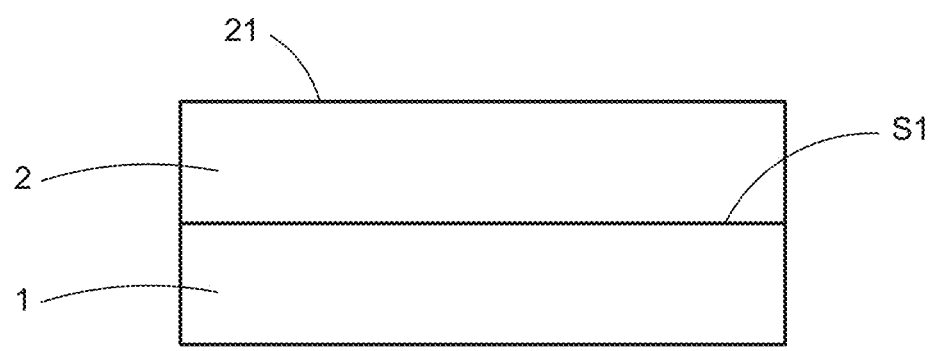

Step SP2: forming a light-tight reflective layer 2 on a top surface S1 of the substrate 1, as shown in FIG. 6B.

Figure 6C:
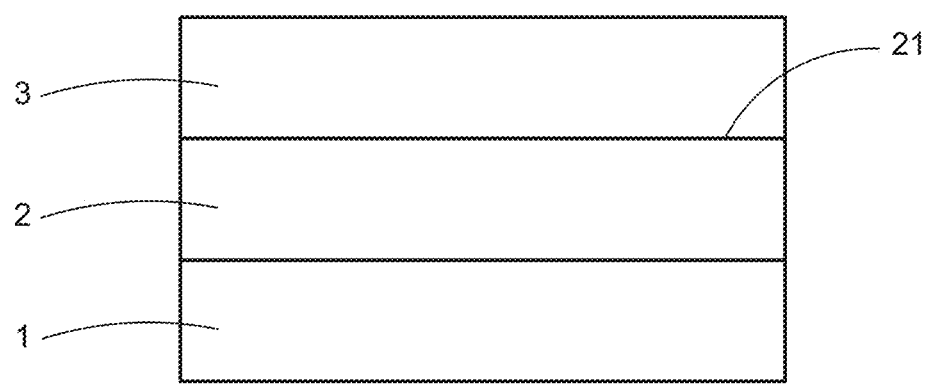

Step SP3: forming an epitaxial layer 3 on a top surface 21 of the light-tight reflective layer, as shown in FIG. 6C.

Step SP4: removing a portion of a material of the epitaxial layer 3 to expose the light-tight reflective layer 2, so as to split the epitaxial layer 3 into an inner epitaxial layer 31 and an outer epitaxial layer 32, wherein the outer epitaxial layer 32 surrounds the inner epitaxial layer 31, as shown in FIGS. 6D1 and 6D2. The removed portion of the epitaxial layer 3 forms a separation space V, wherein, in a view made from a top side of the epitaxial layer 3, the separation space V forms a closed path R. In a cross-section perpendicular to the closed path R, an outside wall 311 of the inner epitaxial layer 31, an inside wall 321 of the outer epitaxial layer 32 and a portion of the top surface 21 of the light-tight reflective layer 2 jointly defines an inverted trapezoid cross-section. Two sides of the inverted trapezoid cross-section are respectively formed of the outside wall 311 of the inner epitaxial layer 31 and the inside wall 321 of the outer epitaxial layer 32, and a base of the inverted trapezoid cross-section is formed of the portion of the top surface 21 of the light-tight reflective layer 2. An included angle θ1 between the outside wall 311 of the inner epitaxial layer 31 and a normal line N of the top surface 21 of the light-tight reflective layer 2 is from 2 to 30 degrees, and an included angle θ2 between the inside wall 321 of the outer epitaxial layer 32 and the normal line N of the top surface 21 of the light-tight reflective layer 2 is from 2 to 30 degrees. A way of removing the portion of the material of the epitaxial layer 3 is to subject the epitaxial layer 3 to etching by applying chemicals thereto, or to subject the epitaxial layer 3 to etching by applying inductively coupled plasma (ICP) thereto.

Figure 6E:
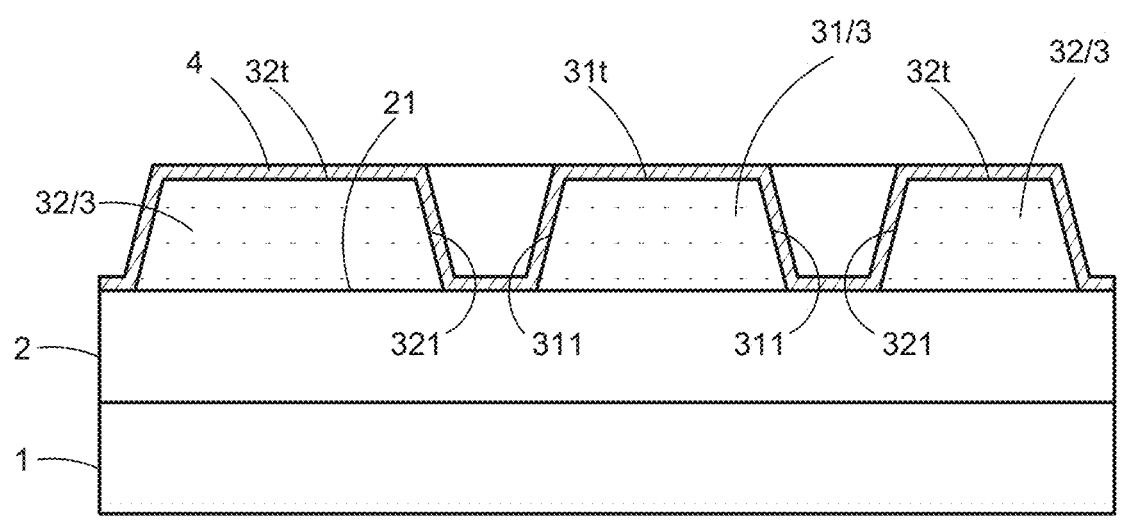

Step SP5: forming a non-conducting layer 4, such that the non-conducting layer 4 covers a top surface 31t and an outside wall 311 of the inner epitaxial layer 31 and a top surface 32t and an inside wall 321 of the outer epitaxial layer 32, and also covers the top surface 21 of the light-tight reflective layer 2 between the inner epitaxial layer 31 and the outer epitaxial layer 32, as shown in FIG. 6E. The non-conducting layer 4 comprises a light-transmitting material. In some embodiments, the non-conducting layer 4 is formed of a film or is alternatively formed of a stack of multiple films. The non-conducting layer 4 is formed of a film of at least one of silicon nitride, silicon oxynitride, silicon dioxide, and titanium dioxide.

Figure 6F:
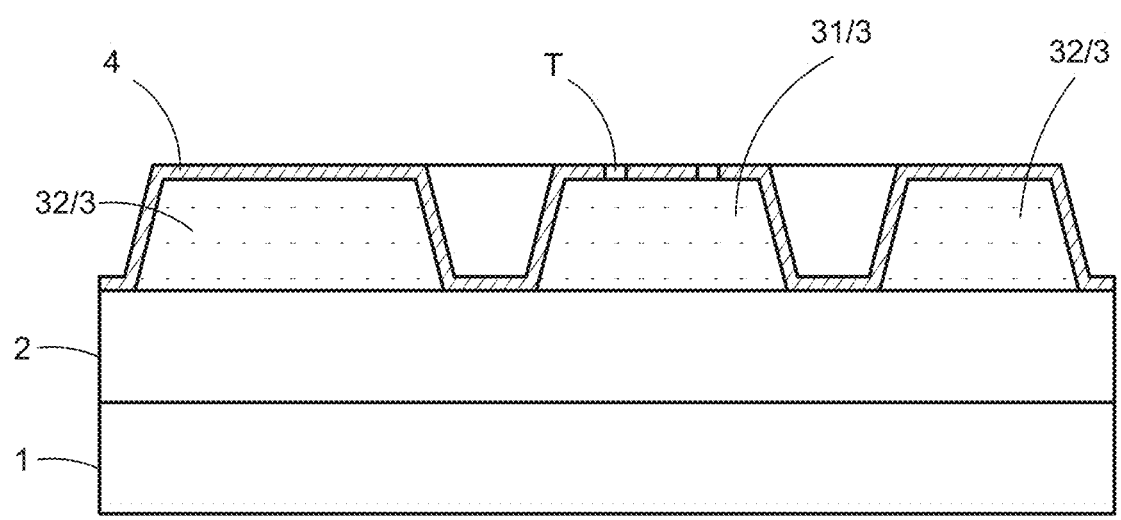

Step SP6: removing a portion of a material of the non-conducting layer 4, as shown in FIG. 6F. After the formation of the non-conducting layer 4, the non-conducting layer 4 is subjected to photolithography and etching to remove a portion of the material of the non-conducting layer 4, so as to form a trough T.

Figure 6G:
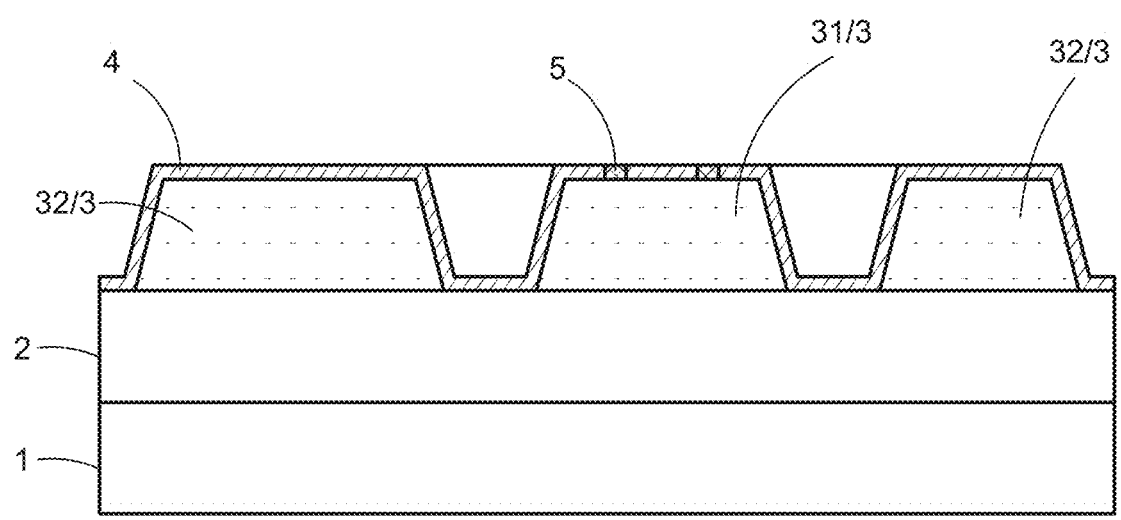

Step SP7: forming an ohmic metallic body 5 in the portion (the trough T) of the non-conducting layer 4 from which the material is removed, so as to have the ohmic metallic body 5 and the inner epitaxial layer 31 electrically connected, as shown in FIG. 6G. The ohmic metallic body 5 may be formed by means of evaporation. After the formation of the ohmic metallic body 5, a lift-off process may be adopted.

Figure 6H:
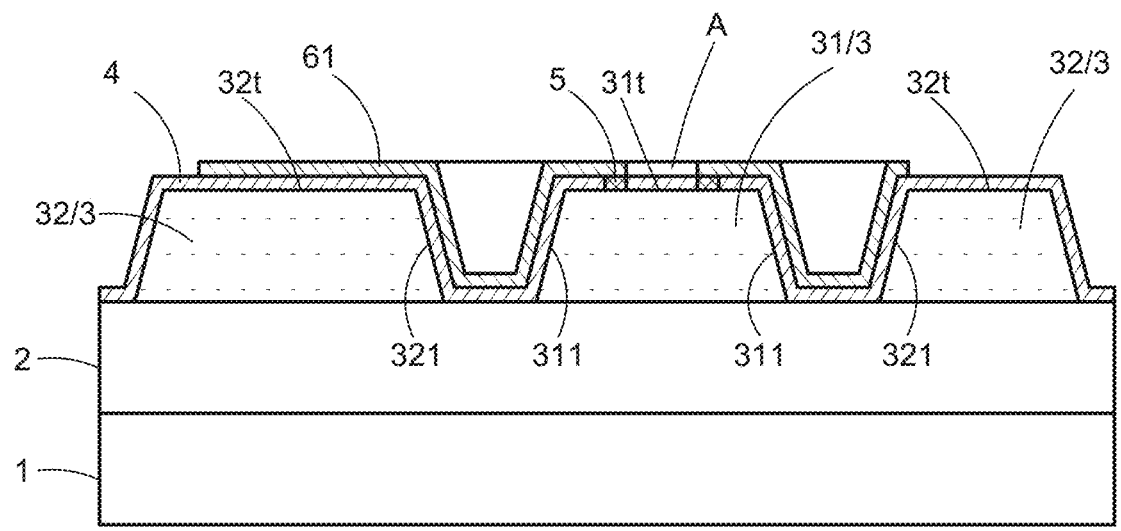

Step SP8: forming a first electrode 61, such that the first electrode 61 is electrically connected with the ohmic metallic body 5, and forming a light exit hole A penetrating through the first electrode 61, as shown in FIG. 6H. The first electrode 61 may be formed through deposition by adopting an evaporation operation. The light exit hole A may be formed by applying a lift-off operation to remove a portion of the material of the first electrode 61. As shown in FIG. 2B, in a view made from a top side of the LED, the light exit hole A is surrounded by the closed path R that is formed of the separation space V.

In Step SP8, an area in which the first electrode 61 is deposited can be adjusted in order to form the LED 100 shown in FIG. 2A, or the LED 100A of FIG. 3, or the LED 100B of FIG. 4. In the LED 100 of FIG. 2A, the first electrode 61 is formed on a portion of the non-conducting layer 4 that covers the top surface 31t and the outside wall 311 of the inner epitaxial layer 31, and is formed on a portion of the non-conducting layer 4 that covers the top surface 32t and the inside wall 321 of the outer epitaxial layer 32, and is also formed on a portion of the non-conducting layer 4 that covers the top surface 21 of the light-tight reflective layer 2 between the inner epitaxial layer 31 and the outer epitaxial layer 32. In the LED 100A of FIG. 3 and the LED 100B of FIG. 4, the first electrode 61 is formed on a portion of the non-conducting layer 4 that covers the top surface 31t of the inner epitaxial layer 31.

For the LED 100A of FIG. 3, the method further comprises Step SP8A: forming a side light reflecting layer 63 on a portion of the non-conducting layer 4 that covers the inside wall 321 of the outer epitaxial layer 32. The side light reflecting layer 63 may be formed in the same deposition operation as the first electrode 61, or they can be separately deposited. For a situation where the side light reflecting layer 63 serves as a wire bonding site, a transparent conductive layer (such as indium tin oxide (ITO)) or wiring (not shown in the drawings) may be further formed to electrically connect the side light reflecting layer 63 and the first electrode 61.

For the LED 100B of FIG. 4, if desired, the method may further comprise Step SP8B: forming a wire bonding portion 64 on a portion of the non-conducting layer 4 that covers the top surface 32t of the outer epitaxial layer 32, and forming a transparent conductive layer (such as indium tin oxide (ITO)) or wiring (not shown in the drawings) to electrically connect the wire bonding portion 64 and the first electrode 61.

Figure 6I:
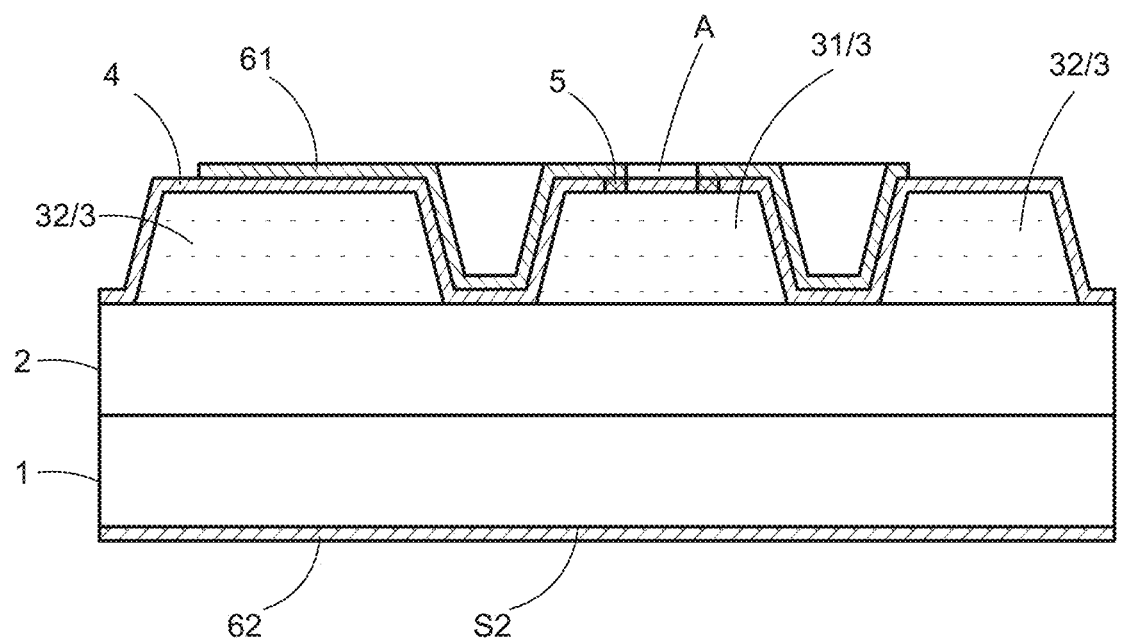

Step SP9: forming a second electrode 62, such that the second electrode 62 is electrically connected with the inner epitaxial layer 31, as shown in FIG. 6I. The second electrode 62 can be formed through deposition by adopting an evaporation operation.

The following provides results of electro-optical tests conducted on the LED 100 according to the present invention. The results of the electro-optical tests demonstrate the efficacy of the LED 100 according to the present invention. The electro-optical tests are carried out by using die testing devices and spectral lamp measurement systems that are available in the market.

Figure 7:
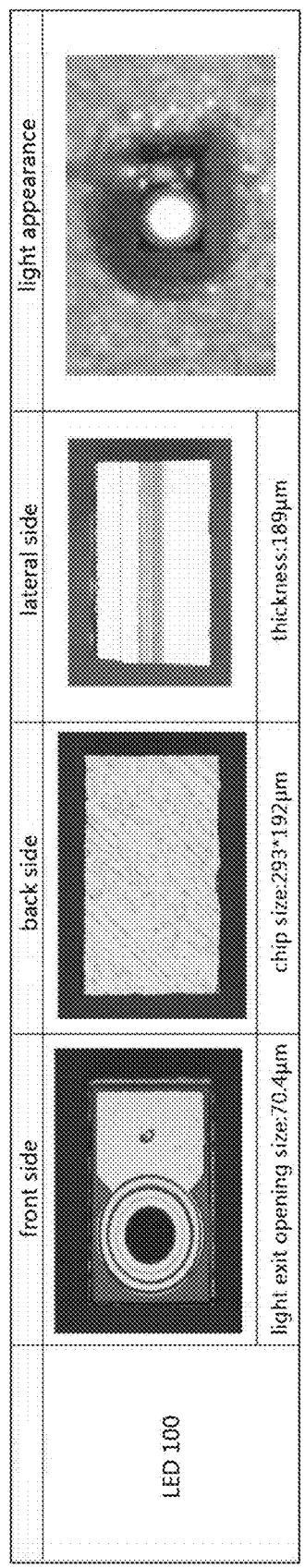
FIG. 7 shows a front-side picture, a back-side picture, a lateral-side picture, and a lighting appearance picture of the LED according to the present invention.

FIG. 7 shows a front-side picture (top plan view), a back-side picture (bottom plan view), a lateral-side picture, and a lighting appearance picture of the LED 100 according to the present invention, wherein the chip size, thickness, and the light exit hole size listed in FIG. 5 are readings of measurement.

Chip specification of the LED 100 that is used in the electro-optical tests is listed in the following Table 1:

TABLE 1

| | LED 100 |
| --- | --- |
| polarity | N-up (N-type doped area of epitaxial layer on top) |
| chip size (mil) | 11.5 × 7.5 |
| light exit hole size (μm) | 70 |
| thickness (μm) | 190 |

Figure 8A:
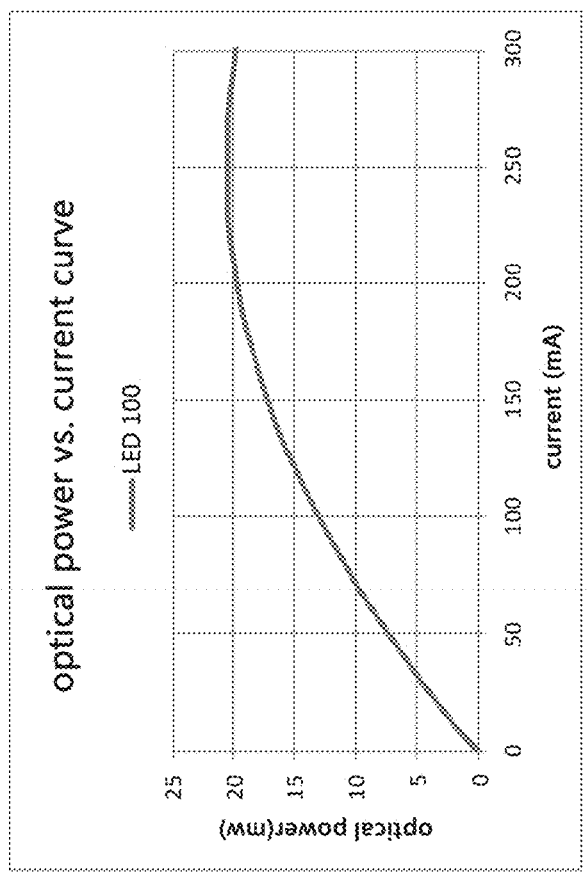
FIG. 8A shows a result curve of optical power vs. current for electro-optical test of the LED according to the present invention tested in a non-packaged bare-die state.
Figure 8B:
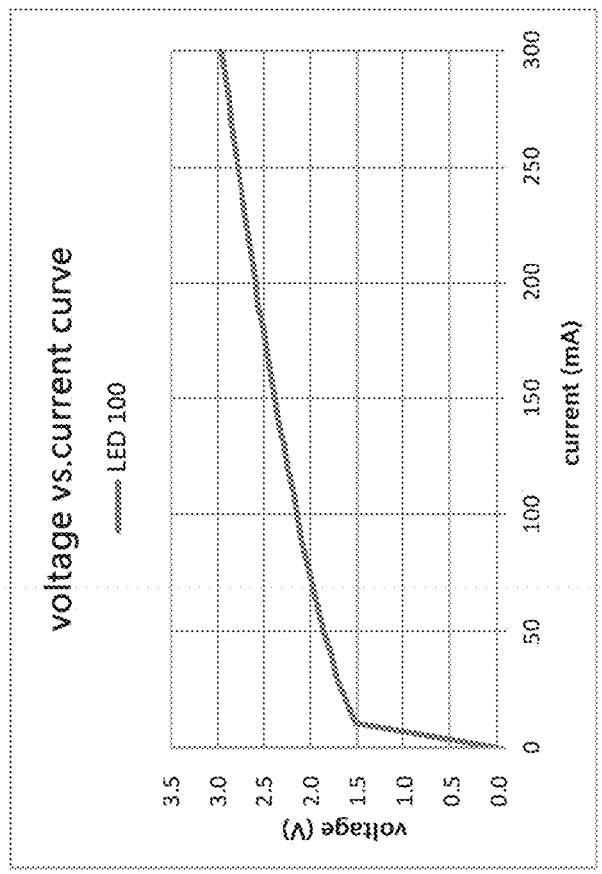
FIG. 8B shows a result curve of voltage vs. current for electro-optical test of the LED according to the present invention tested in a non-packaged bare-die state.

An optical power vs. forward current curve and a forward voltage vs. forward current curve of the LED 100 subjected to the electro-optical tests in a non-packaged bare-die state are respectively shown in FIGS. 8A and 8B, wherein the ordinate of FIG. 8A indicates optical power (mW) that represents a value of the optical power transmitting out of the light exit opening plus sideway optical power. In FIGS. 8A and 8B, under a forward current of 20 mA, the forward voltage, the optical power, and the saturation current of each chip is listed in the following Table 2:

TABLE 2

|  | LED 100 |
| --- | --- |
| forward voltage (V) | 1.62 |
| optical power transmitting out of light exit opening + sideway optical power (mW) | 3.25 |
| peak wavelength (nm) | 852.9 |
| Saturation current (mA) | 250 |

The LED 100 can be packaged in a To-Can form, and under the test condition that the forward current is 20 mA, the forward voltage, the optical power, the side light ratio, the peak wavelength, and the lighting angle are listed in the following Table 3:

TABLE 3

|  | LED 100 |
| --- | --- |
| forward voltage (V) | 1.63 |
| optical power transmitting out of light exit opening + sideway optical power (mw) | 2.07 |
| sideway optical power (mw) | 0.01 |
| side light ratio | 0.30% |
| peak wavelength (nm) | 854.5 |
| lighting angle (°) | 119.74 |

Figure 9:
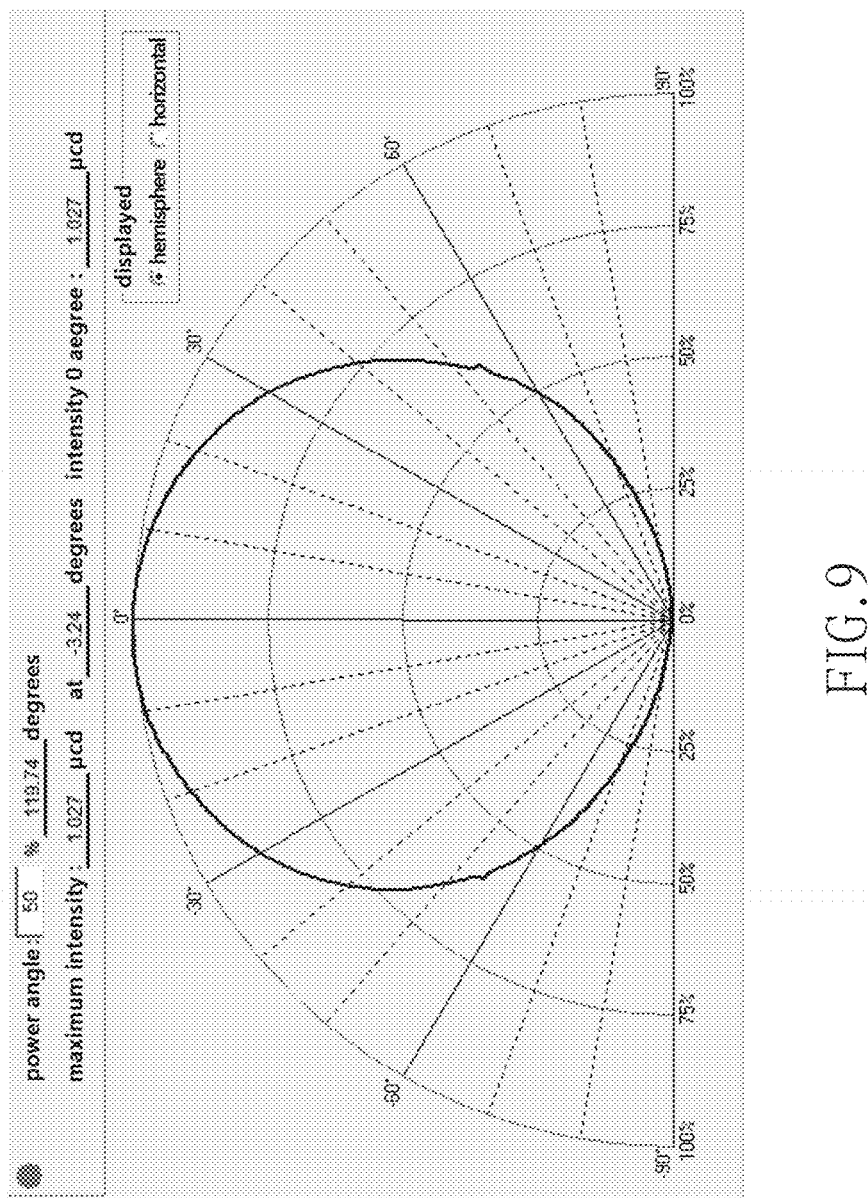
FIG. 9 shows a polar diagram of an optical power distribution of the LED according to the present invention under a condition of a forward current being 20 mA.

Under the condition that the forward current is 20 mA, a distribution of the optical power of the LED 100 in a polar coordinate is shown in FIG. 9. The lighting angle shown in Table 3 designates the power angle for 50% optical power of FIG. 9. The side light ratio indicates a ratio between the sideway optical power and a sum of the optical power transmitting through the light exit opening and the sideway optical power. It is known from the above data that when packaged in a To-Can form, under the condition that the forward current is 20 mA, the LED 100 demonstrates a relatively low side light ratio, which is less than 1%.

It is known from the above test results that the LED according to the present invention provides a structure that includes a separation space to block or isolate an electrical current of the inner epitaxial layer can effectively reduce the sideway lighting of the chip, making the chip showing a reduced side light ratio. Thus, the LED according to the present invention, when applied to a reflective encoder, helps reduce noise of optical sensors and reduce the chance of erroneous detection.

It is noted that in the specification and the claims provided herein, "upper", "top surface", "top side", "top view", "bottom view", "lateral side", "outer side" are terms for describing relatively positions, which are based on the relative positions of a component exhibited in the drawings, and are used only for the purposes of easy description and reference of the present invention and are not intended to limit the absolute position of each component and/or feature of the LED according to the present invention.

The description provided above is only concerned about the preferred embodiments of the present invention and is not intended to limit the scope of the present invention as defined in the claims. Equivalent alterations in respect of structures that are made according to the contents of the specification and the drawings of the present invention should be considered equally falling in the scope of the present invention defined by the claims.

What is claimed is:

1. A light-emitting diode (LED), comprising:
a substrate, which comprises a top surface and a bottom surface, the top surface and the bottom surface being opposite to each other;
a light-tight reflective layer, which is formed on the top surface of the substrate;
an epitaxial layer, which comprises an inner epitaxial layer and an outer epitaxial layer,
wherein the inner epitaxial layer is formed on a poring of the top surface of the light-tight reflective layer, and
the outer epitaxial layer is formed on a portion of the top surface of the light-tight reflective layer and surrounds the inner epitaxial layer, the inner epitaxial layer and the outer epitaxial layer being not in contact with each other, a separation space being located between the inner epitaxial layer and the outer epitaxial layer, wherein, in a view made from a top side of the LED, the separation space forms a closed path, and in a cross-section perpendicular to the closed path, an outside wall of the inner epitaxial layer, an inside wall of the outer epitaxial layer, and a portion of the top surface of the light-tight reflective layer jointly define an inverted trapezoid cross-section, and two sides of the inverted trapezoid cross-section are respectively formed of the outside wall of the inner epitaxial layer and the inside wall of the outer epitaxial layer, and a base of the inverted trapezoid cross-section is formed of the portion of the top surface of the light-tight reflective layer, an included angle between the outside wall of the inner epitaxial layer and a normal line of the top surface of the light-tight reflective layer being from 2 to 30 degrees, an included angle between the inside wall of the outer epitaxial layer and a normal line of the top surface of the light-tight reflective layer being from 2 to 30 degrees;
a non-conducting layer, which covers a top surface and the outside wall of the inner epitaxial layer and a top surface and the inside wall of the outer epitaxial layer, and covers a portion of the top surface of the light-tight reflective layer between the inner epitaxial layer and the outer epitaxial layer, the non-conducting layer comprising a light-transmitting material;
an ohmic metallic body, which is disposed in the non-conducting layer, the ohmic metallic body being in electrical connection with the inner epitaxial layer;
a first electrode, which is in electrical connection with the ohmic metallic body, the first electrode comprising a light-reflecting material, a light exit hole in a circular form being formed in the first electrode, the light exit hole being located in a top side of the LED, wherein, in a view made from a top side of the LED, the separation space forms a closed path and surrounds the light exit hole; and
a second electrode, which is in electrical connection with the inner epitaxial layer.

2. The LED according to claim 1, wherein the first electrode is arranged on a portion of the non-conducting layer that covers the top surface and the outside wall of the inner epitaxial layer, and is also arranged on a portion of the non-conducting layer that covers the top surface and the inside wall of the outer epitaxial layer, and is also arranged on a portion of the non-conducting layer that covers the top surface of the light-tight reflective layer between the inner epitaxial layer and the outer epitaxial layer.

3. The LED according to claim 1, wherein the first electrode is arranged on a portion of the non-conducting layer that covers the top surface of the inner epitaxial layer and does not block light emitting from the outside wall of the inner epitaxial layer, the non-conducting layer comprising one film or a stack of multiple films, the non-conducting layer being arranged to redirect light emitting from an inside wall of the inner epitaxial layer toward a top side of the LED, the LED further comprising a side light reflecting layer, the side light reflecting layer being arranged on a portion of the non-conducting layer that covers the inside wall of the outer epitaxial layer, the side light reflecting layer being arranged to reflect light emitting from the outside wall of the inner epitaxial layer toward the top side of the LED.

4. The LED according to claim 1, wherein the first electrode is arranged on a portion of the non-conducting layer that covers the top surface of the inner epitaxial layer and does not block light emitting from the outside wall of the inner epitaxial layer, the non-conducting layer comprising one film or a stack of multiple films, the non-conducting layer being arranged to redirect or reflect light emitting from an inside wall of the inner epitaxial layer toward a top side of the LED.

5. The LED according to claim 4, wherein the non-conducting layer is formed of a film of at least one of silicon nitride, silicon oxynitride, silicon dioxide, and titanium dioxide.

6. The LED according to claim 1, wherein, in a view made from a topside of the LED, the closed path is circular in shape, and the separation space and the light exit hole form concentric circles.

7. The LED according to claim 2, wherein the substrate comprises a silicon substrate, an aluminum oxide substrate, or an aluminum nitride substrate.

8. The LED according to claim 2, wherein a material of the epitaxial layer comprises aluminum gallium indium phosphide (AlInGaP) or aluminum gallium arsenide (AlGaAs).

9. A light-emitting diode (LED) manufacturing method, comprising:
provviding a substrate, wherein the substrate comprises a top surface and a bottom surface, the top surface and the bottom surface being opposite to each other;
forming a light-tight reflective layer on a top surface of the substrate;
forming an epitaxial layer on a top surface of the light-tight reflective layer;
removing a portion of a material of the epitaxial layer to expose the light-tight reflective layer, wherein the removed portion of the epitaxial layer forms a separation space, and the separation space splits the epitaxial layer into an inner epitaxial layer and an outer epitaxial layer, such that the outer epitaxial layer surrounds the inner epitaxial layer, wherein, in a view made from a top side of the LED, the separation space forms a closed path and surrounds a light exit hole, and, in a cross-section perpendicular to the closed path, an outside wall of the inner epitaxial layer, an inside wall of the outer epitaxial layer, and a portion of the top surface of the light-tight reflective layer jointly define an inverted trapezoid cross-section, two sides of the inverted trapezoid cross-section being respectively formed of the outside wall of the inner epitaxial layer and the inside wall of the outer epitaxial layer, a base of the inverted trapezoid cross-section being formed of the portion of the top surface of the light-tight reflective layer, an included angle between the outside wall of the inner epitaxial layer and a normal line of the top surface of the light-tight reflective layer being from 2 to 30 degrees, an included angle between the inside wall of the outer epitaxial layer and a normal line of the top surface of the light-tight reflective layer being from 2 to 30 degrees;
forming a non-conducting layer, such that the non-conducting layer covers a top surface and the outside wall of the inner epitaxial layer and a top surface and the inside wall of the outer epitaxial layer, and also covers the top surface of the light-tight reflective layer between the inner epitaxial layer and the outer epitaxial layer, wherein the non-conducting layer comprises a light-transmitting material;
removing a portion of a material of the non-conducting layer and forming an ohmic metallic body in the portion of the non-conducting layer from which the material is removed, so as to have the ohmic metallic body and the epitaxial layer electrically connected;
forming a first electrode, such that the first electrode is electrically connected with the ohmic metallic body, and forming a light exit hole penetrating through the first electrode, wherein the first electrode is non-light-transmittable, and the light exit hole is located on a top of the LED, wherein, in a view made from a top side of the LED, the separation space forms a closed path and surrounds the light exit hole; and
forming a second electrode, such that the second electrode is electrically connected with the inner epitaxial layer.

10. The LED manufacturing method according to claim 9, wherein the first electrode is formed on a portion of the non-conducting layer that covers the top surface and the outside wall of the inner epitaxial layer and is also formed on a portion of the non-conducting layer that covers the top surface and the inside wall of the outer epitaxial layer, and is also formed on a portion of the non-conducting layer that covers the top surface of the light-tight reflective layer between the inner epitaxial layer and the outer epitaxial layer.

11. The LED manufacturing method according to claim 9, wherein the first electrode is formed on a portion of the non-conducting layer that covers the top surface and the outside wall of the inner epitaxial layer, and the LED manufacturing method further comprises forming a side light reflecting layer on a portion of the non-conducting layer that covers the inside wall of the outer epitaxial layer.

12. The LED manufacturing method according to claim 9, wherein the non-conducting layer is formed of a film or is alternatively formed of a stack of multiple films.

13. The LED manufacturing method according to claim 10, wherein, in a view made from a top side of the LED, the closed path is circular in shape, and the separation space and the light exit hole form concentric circles.

14. The LED manufacturing method according to claim 9, wherein the removal of the portion of the material of the epitaxial layer is performed by subjecting the epitaxial layer to etching by applying chemicals.

15. The LED manufacturing method according to claim 9, wherein the removal of the portion of the material of the epitaxial layer is performed by subjecting the epitaxial layer to etching by means of inductively coupled plasma (ICP).

* * * * *